United States Patent
Orendi et al.

(10) Patent No.: US 9,151,804 B2
(45) Date of Patent: Oct. 6, 2015

(54) ON-CHIP TEST TECHNIQUE FOR LOW DROP-OUT REGULATORS

(75) Inventors: Dietmar Orendi, Frickenhausen-Linsenhofen (DE); Biren Minhas, Bristol (GB); Robert Baraniecki, Kirchheim-Teck (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 493 days.

(21) Appl. No.: 13/443,919

(22) Filed: Apr. 11, 2012

(65) Prior Publication Data

US 2013/0265060 A1 Oct. 10, 2013

(30) Foreign Application Priority Data

Apr. 6, 2012 (EP) ..................... 12368009

(51) Int. Cl.
   G01R 19/00 (2006.01)
   G01R 31/40 (2014.01)
   G01R 31/317 (2006.01)

(52) U.S. Cl.
   CPC .......... *G01R 31/40* (2013.01); *G01R 31/31721* (2013.01)

(58) Field of Classification Search
   CPC .................... G01R 31/31721; G01R 31/40
   USPC .................. 324/537, 764.01, 76.11
   See application file for complete search history.

(56) References Cited

U.S. PATENT DOCUMENTS

| | | | |
|---|---|---|---|
| 5,929,617 A | 7/1999 | Brokaw | |
| 6,373,233 B2 | 4/2002 | Bakker et al. | |
| 6,414,537 B1 | 7/2002 | Smith | |
| 6,465,994 B1 | 10/2002 | Xi | |
| 6,603,326 B1 | 8/2003 | Tse et al. | |
| 6,759,856 B2 | 7/2004 | Tse et al. | |
| 7,459,886 B1 | 12/2008 | Potanin et al. | |
| 7,626,367 B2 | 12/2009 | Tsai | |
| 7,714,640 B2 | 5/2010 | Imtiaz | |
| 8,054,057 B2 | 11/2011 | Dash et al. | |
| 2005/0040841 A1 | 2/2005 | Iadanza | |
| 2008/0109691 A1 | 5/2008 | Dieffenderfer et al. | |
| 2008/0174289 A1* | 7/2008 | Gurcan et al. | 323/280 |
| 2009/0072810 A1 | 3/2009 | Lee et al. | |
| 2009/0284246 A1* | 11/2009 | Dash et al. | 324/76.11 |
| 2010/0109435 A1* | 5/2010 | Ahmadi et al. | 307/31 |
| 2011/0101937 A1 | 5/2011 | Dobkin et al. | |

OTHER PUBLICATIONS

"Self-Calibration of Input-Match in RF Front-End Circuitry," by Tejasvi Das et al., IEEE Transactions on Circuits and Systems—II: Express Briefs, vol. 52, No. 12, Dec. 2005, pp. 821-825.
European Search Report, 12368009.2-2216, Mail date—Sep. 28, 2012, Dialog Semiconductor GmbH.

* cited by examiner

*Primary Examiner* — Jermele M Hollington
*Assistant Examiner* — Farhana Hoque
(74) *Attorney, Agent, or Firm* — Saile Ackerman LLC; Stephen B. Ackerman

(57) ABSTRACT

A circuit and method is described for automatically testing multiple LDO regulator circuits on an integrated circuit chip independent of an ATE. Each LDO regulator is tested for voltage at a specified current output capability, wherein the output driver transistor is formed by at least two pass transistors, which are each tested for voltage output at a particular current capability. The test results are delivered back to the ATE and for a failed test, the gate voltage of the pass device can be observed through an analog multiplexer to enable debug.

3 Claims, 3 Drawing Sheets

ON-CHIP TEST TECHNIQUE FOR LOW DROP-OUT REGULATORS

TECHNICAL FIELD

The present disclosure is related to testing integrated circuits and in particular to testing low drop-out regulators.

BACKGROUND

A major portion of circuitry on integrated circuit chips performing power management is allocated to low drop-out (LDO) regulators. The LDO regulators supply power to both on-chip and off-chip circuitry. The number of LDO circuits on any particular integrated circuit chip can be large, leading to a substantial test time allocated to the testing of LDO circuits. Further, multiple specification measurements of LDO circuits cause an additional load on automatic test equipment (ATE) that affects the time an ATE must be used to test an integrated circuit containing LDO circuitry, comprising device control protocol (DCP), external components and driver software, and adding to test time and product cost.

US 2010/0109435 (Ahmadi et al) is directed to a system, method and apparatus employed to generate multiple, regulated and isolated power supply voltages, wherein a first and second pass transistor are controlled to provide regulated voltage to two separate circuit loads. US 2009/0284246 A1 (Dash et al.) is directed to a device and system for testing a low dropout (LDO) regulator. US 2009/0206919 A1 (Imtiaz), is directed to a circuit and method devoid of trim resistors to optimized output voltage circuit. In US 2009/0072810 A1 (Lee et al) a voltage drop measuring circuit is directed to a sensing circuit and a voltage drop detecting circuit. US 2003/0206025 (Tse et al.) is directed to a switching regulator comprising a power transistor partitioned into a plurality individually addressable transistor segments. In U.S. Pat. No. 7,626,367 B2 (Tsai) an integrated circuit is directed to providing an output voltage substantially equal to a reference voltage using an LDO regulator and include a fast turn-off and fast turn-on circuitry. U.S. Pat. No. 7,459,886 B1 (Potanin et al.) is directed to a circuit and method for simultaneously charging a battery and providing a supply voltage to a load using in part an LDO regulator. U.S. Pat. No. 6,465,994 B1 (Xi) is directed to a low dropout voltage regulator having variable bandwidth depending on load current. U.S. Pat. No. 6,414,537 B1 (Smith) is directed to a voltage regulator circuit with a low dropout voltage and a fast disable capability. In U.S. Pat. No. 6,373,233 B2 (Bakker et al.) a low dropout regulator is directed to a stable condition in the presence of capacitive loads. U.S. Pat. No. 5,929,617 (Brokaw) is directed to an LDO regulator and method for reducing regulator drive when the output voltage of the regulator is going out of regulation caused by a falling input voltage.

A testing method and implementation is needed to reduce the time and cost of testing LDO circuitry on integrated circuit chip comprising the reduction of an ATE to thoroughly test the LDO circuitry to multiple specifications to guarantee proper operation.

SUMMARY

It is an objective of the present disclosure to provide the capability to reduce ATE test time and the use of external components required to test an LDO circuit.

It is an also objective of the present disclosure to provide an on-chip capability to test output voltage of an LDO circuit.

It is further an object of the present disclosure to provide an on-chip capability to test the load current of an LDO circuit.

It is still further an objective of the present disclosure to test the on resistance of an LDO circuit.

In the present disclosure on-chip testing of the LDO is performed with an on-chip measurement (OCM) circuit controlled by a finite state machine (FSM). The on-chip test configuration to test the LDO circuit is independent of an ATE, and frees the ATE to perform other test on the chip while the on-chip tests of the LDO are being performed. This is particularly important where there are a large number of LDO circuits on a chip, which would require a large amount of ATE resources and test time if the test of the LDO circuits were performed using the ATE. Being able to overlap on-chip testing of the LDO circuits with other tests performed by the ATE reduces test time and reduces cost of testing the chip containing the LDO circuits.

In order to avoid large currents flowing through the LDO pass transistor (output driver), which also must flow through the voltage terminals of the chip from the ATE, the LDO pass transistor is segmented into N individual transistor that are connected in parallel to provide the total current required to be delivered from the LDO during normal operation. During test, each of the N transistor portions of the pass transistor are separately selected, which reduces the test current, wherein the gate to source voltage of one of the N transistors with a reduced load provides a measurement equivalent to all N segmented pass transistors operating at full load. Each segmented transistor is measured to insure that each segment is within specifications.

A current DAC (IDAC) is used to provide a bias current to a current mirror circuit capable of sinking/sourcing a load current for the LDO circuit under test. In order to provide an accurate current, the IDAC needs to be biased from a reference voltage, for instance a bandgap voltage source. A first analog switch connects the LDO pass circuit under test to the current mirror circuit to provide either a source or a load depending upon control signals from the FSM. The IDAC controls the amplitude of the current that the current mirror circuit is providing to the LDO circuit. The first analog switch needs to have a low insertion impedance because the current path to the LDO circuits is low impedance and needs to be kept low so as not to introduce an unacceptable error in the voltage measurement of the LDO circuit. A second analog switch connects LDO output voltages to a voltage comparator. Since the input to the voltage comparator is high impedance, the second analog can have a relatively high insertion impedance.

The output voltage (Vldo) of a LDO circuit under test and corresponding high and low reference voltages are connected to a comparator to determine if the output voltage of the LDO circuit falls between the high test limit and the low test limit of the output voltage. The reference voltages are generated by a resistor string and are connected to the respective inputs of the comparator, but could be generated by any other means that provides the required reference voltages. The comparator output is measured compared with a pre-defined test pattern, wherein a set of test registers located in the FSM are used to control the OCM.

In addition the FSM measures the time for startup and turn off of the LDO circuitry. The regulation loop of the present disclosure measures the ability to recover from a current limit as well as the inability of the of a current limit to activate. The IDAC circuitry measures the regulation loop at low load and maximum load as well as the current capability of each segment of the LDO output circuit. The current consumption of the LDO circuitry is measured by the ATE.

The OCM provides a pass/fail signal after each measurement, so the tester will know which test has failed. For a failed test, the gate voltage of the pass device can be observed through an analog multiplexer to enable debug.

BRIEF DESCRIPTION OF THE DRAWINGS

This disclosure will be described with reference to the accompanying drawings, wherein.

DETAILED DESCRIPTION

Figure 1:
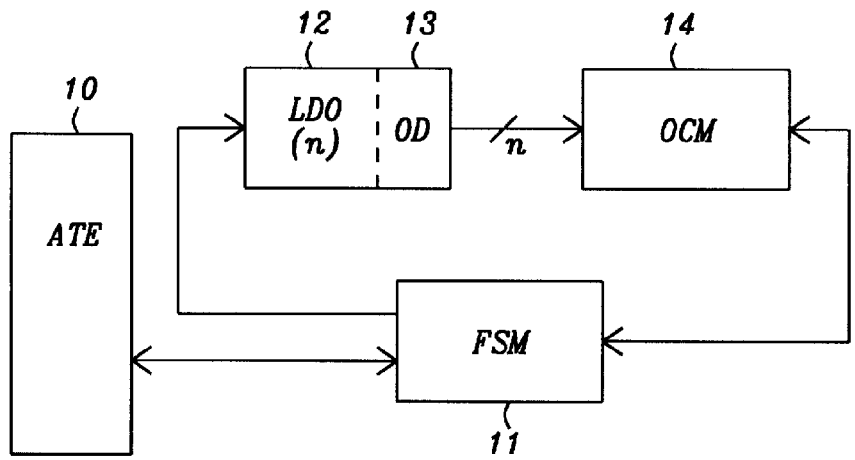
FIG. 1 is a block diagram of the interconnection of major elements of the present disclosure.

FIG. 1 is a block diagram of the major building blocks of the present disclosure. Shown is the measurement loop between a finite state machine (FSM) 11, a plurality of low drop out (LDO) regulators 12, wherein each LDO regulator has an output driver circuit OD 13, and on chip measurement (OCM) circuit 14. An automatic tester ATE 10 communicates with the FSM 11 to initiate on chip testing and receives back from the FSM test results. After tests have been initiated by the ATE, the FSM 11 assumes control and executes commands to perform a series of tests on the plurality of LDO circuits 12. In the mean time the ATE 10 proceeds to, perform other tests on the integrated circuit chip in parallel to the tests performed on the LDO circuits 12.

After the ATE 10 signals the FSM 11 to start the on-chip testing, the FSM communicates with a particular LDO circuit 12 to connect to the OCM circuit 14 an analog signal that is to be measured by the OCM circuitry. At the same time the FSM 11 communicates with the OCM circuitry 14 what measurements are to be performed. After the OCM circuitry 14 has performed a measurement, the OCM circuitry communicates a pass or fail signal to the FSM, and the FSM 14 then communicates the test results back to the ATE, which is performing other tests on the integrated circuit chip containing the LDO circuits. On most integrated circuit chips there is more than one LDO circuit as indicated by the "n" in the LDO block of FIG. 1. Each of the "n" LDO circuits is measured by the OCM circuitry 14, and the results of each measurement are communicated to the FSM 10 and then the ATE 11.

Figure 2:
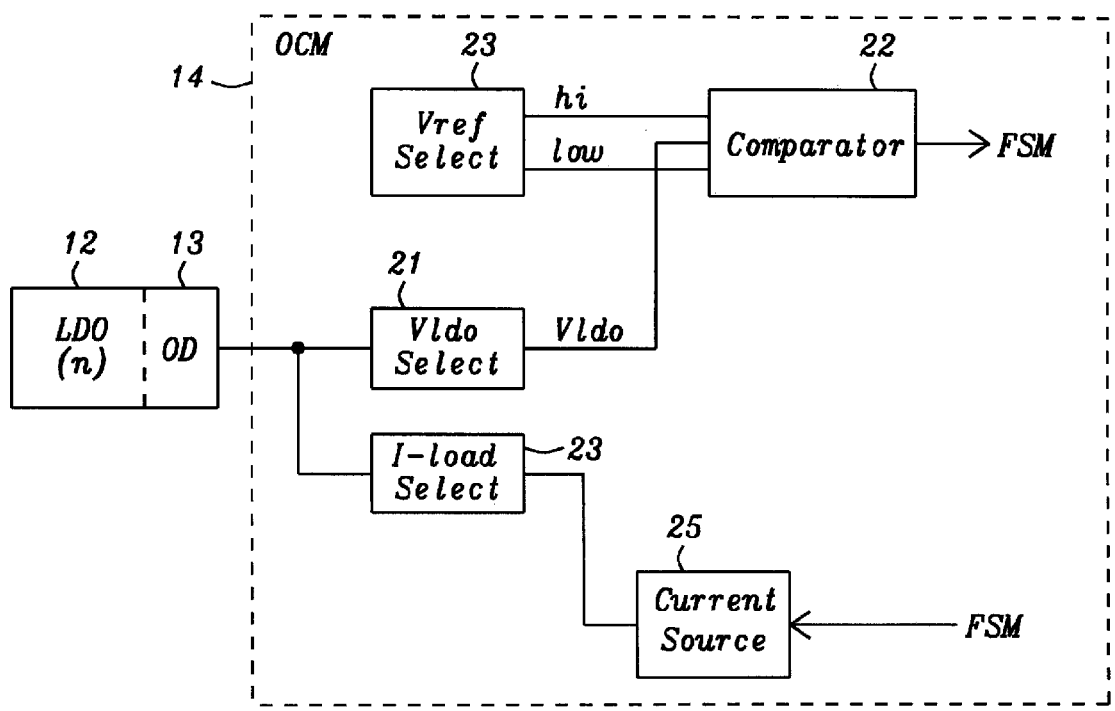
FIG. 2 is a block diagram of the on chip measurement system (OCM) for low drop out (LDO) voltage regulators of the present disclosure.

In FIG. 2 is shown a block diagram of the measurement circuitry of the OCM 14 connected to the output drivers OD 13 of the LDO circuit 12. The output driver (OD) 13 is a pass transistor that has been segmented into at least two transistor parts operating in parallel to be able to supply the demand for current from circuitry on the integrated circuit chip and allow testing by test circuitry that has limited current capability, e.g. the ATM.

When a voltage output of the LDO circuit is to be measure by the OCM 14, the FSM 11 signals the OCM 14 to select an output voltage Vldo from an output driver OD 13 using the Vldo select circuit 21. Further since the output driver is segmented into a plurality of driver transistors to accommodate the limited current capability of the tester, the FSM chooses which segmented driver transistor is to be connected to the OCM. Each of the segmented driver transistors of the output driver OD of a particular low drop out voltage generator will in turn be connected to the OCM 14 and thereafter the FSM will select the next output driver 13 of the next LDO circuit 12 to be selected for test by the Vldo select circuit 21.

The Vldo select circuit 21 is an analog switch that connects the output voltage of each of the (n) LDO circuits 12 to the comparator 22 under the control of the FSM. Also connected to the input of the comparator 22 is a "hi" and a "low" reference from the Vref select circuit 23. Depending upon the measurement being performed, the value of the "hi" and "low" reference signals connected to the input of the comparator 22 are adjusted by the FSM 11. The purpose of the comparator is to assure that the voltage output of each LDO falls within the test limits set by the "hi" and "low", which are outputted from the Vref select circuit 23 under the control of the FSM to the comparator 22. After each measurement by the comparator 22, the comparator communicates the results the measurement results back to the FSM 11, wherefrom the FSM relays the measurement results back to the ATE 10.

The output driver (OD) 13 of the LDO circuit 12 is formed by a segmented transistor in which each segment is connected in parallel to provide the required current in normal operations and selected separately for test purposes. When a LDO is to be measured for the ability to produce a voltage within test limits, an output driver transistor segment is selected and through an I-load select circuit 23 connected to a current source circuit. The I-load select circuit 23 is a low impedance analog switch, and the current source is selectable to perform as either a source, or a load, for the output driver OD 13 of the LDO circuit 12 being tested.

Figure 3:
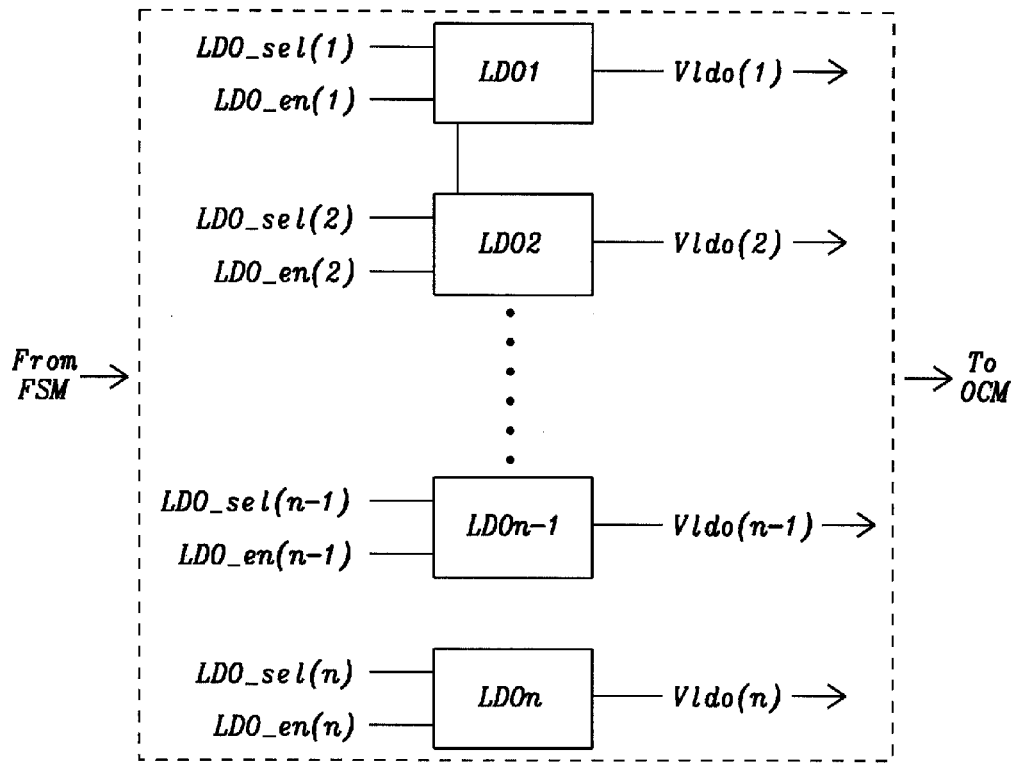
FIG. 3 is a diagram for the selection and enabling of multiple LDO circuits of the present disclosure.

In FIG. 3 is shown a plurality of LDO circuits found on an integrated circuit chip and used to supply various voltages necessary to operate the circuits on the integrated circuit chip. There are n LDO circuits each having, a select sel(n) input, an enable en(n) input and each delivering a regulated voltage Vldo(n). The FSM selects and enables each LDO circuit of the plurality of LDO circuits in turn and signals the OCM 14 to perform voltage measurements on the output of each LDO circuit when selected, enabled and connected to the current source circuit to provide the source and load conditions to the LDO 12 output driver 13 circuitry.

Figure 4:
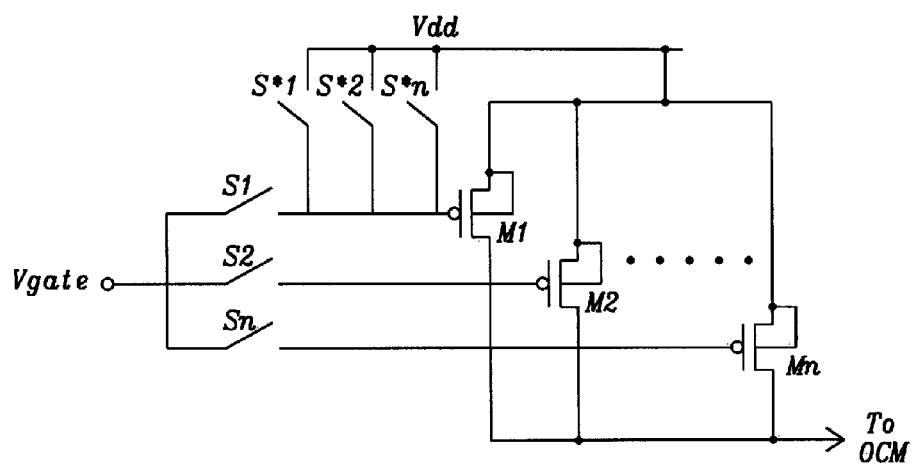
FIG. 4 is a circuit diagram of a segmented pass transistor of an LDO regulator for the selection of portions segmented portions of the present disclosure.

FIG. 4 is a schematic diagram of the output driver circuit 13 forming a part of the LDO circuit 12. The output driver circuit 13 is formed by a plurality of driver transistors M1, M2, to Mn connected in parallel between a voltage Vdd and the circuitry being driven by the LDO circuit. During test, the circuitry being driven, or connected to, is the load select circuit 23 and through which the current source circuit 25. The current source circuit 25 is the circuit that provides source and load currents to the output driver transistors 13 for test purposes. Each gate of the Mn driver transistors is separately selected by switches S1, S2, and Sn and biased off by switches S*1, S*2 and S*n to allow individual testing of each output drive transistor M1, M2 to Mn. During normal operation of the LDO all switches S1, S2, to Sn are closed and all switches S*1, S*2 to S*n are open to allow all output driver transistors to operate in parallel to produce the necessary LDO output current.

Figure 5:
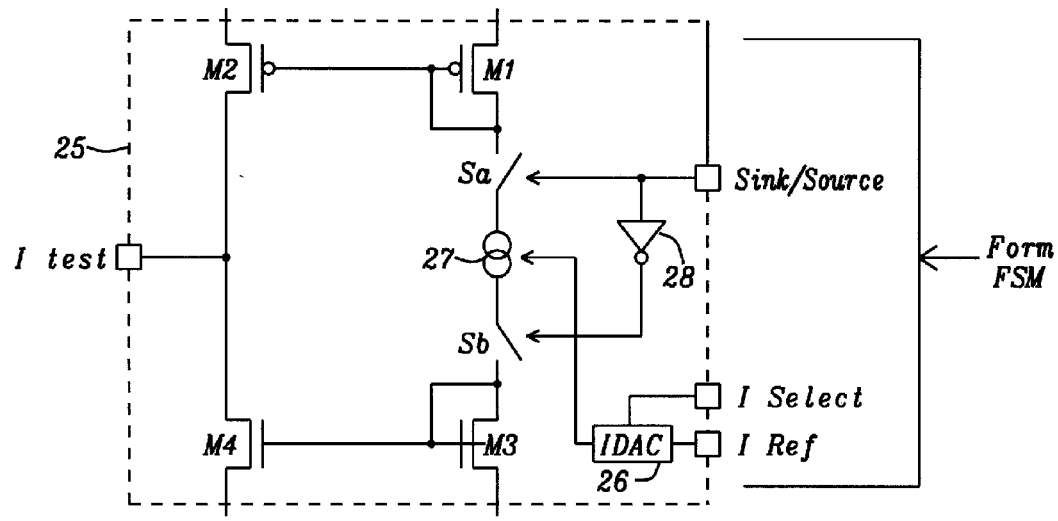
FIG. 5 is a circuit diagram of the current source for the OCM used to test LDO circuits of the present disclosure.

FIG. 5 is a circuit diagram of the current source circuit 25 of the OCM 14 that is used to provide a current source, or load, to the output driver circuits 13 during test of the LDO circuits 12. The current source 25 comprises two current mirror circuits The current can be sinked using a NMOS current mirror, comprising transistors M4 and M5, or sourced using a PMOS current mirror, comprising transistors M1 and M2. Whether the current is sinked or sourced is determined by the "sink source" signal, which selects switch Sa to form a source and is inverted 28 to select switch Sb to form a load for the LDO circuit. A reference for the current mirror circuitry is generated by an IDAC (current DAC) 28 that controls the reference generator 27. In order to generate several output currents "I test", the current coming from the IDAC can be adjusted with the "I Select" signal. The reference current "I Ref" can be generated from an accurate source (bandgap). The output current "I test" provided by the current source can be in the range of several milliamps. But this is depending on the number of segments of the pass transistor being tested.

Figure 6:
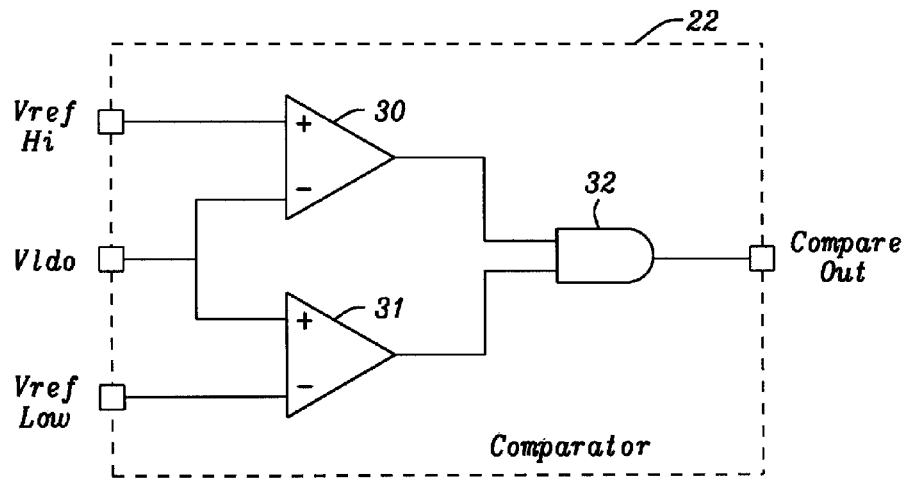
FIG. 6 is a voltage window comparator circuit of the OCM used to test LDO circuits of the present disclosure.

FIG. 6 is a diagram of the comparator circuit 22 that measures whether the LDO circuit output voltage Vldo is between a Hi Vref and a Low Vref. The output voltage of the LDO circuit is connected to a minus input terminal of amplifier 30 and to the positive input terminal of amplifier 31, where a Hi Vref is connected to the positive input terminal of amplifier 30 and a Low Vref is connected to the negative terminal of amplifier 31. The outputs of both amplifiers are connected to inputs of an "and" circuit 32, which produces a high state in the compare output when the LDO output voltage Vldo falls between Vref Hi and Vref Low. The compare out signal is connected to the FSM, which passes the test results back the ATE.

While the disclosure has been particularly shown and described with reference to preferred embodiments thereof, it will be understood by those skilled in the art that various changes in form and details may be made without departing from the spirit and scope of the disclosure.

What is claimed is:

1. A method for testing an on-chip voltage regulator, comprising:
    a) initiating operation of a finite state machine (FSM) to commence testing of a low drop out (LDO) regulator circuit by automatic test equipment (ATE);
    b) controlling an on-chip measurement (OCM) circuit with said FSM to perform measurements;
    c) selecting an LDO regulator circuit of a plurality of LDO regulator circuits to produce voltages at specified output currents to be measured by the OCM, wherein said measurements performed by the OCM circuitry comprise measurements of the output voltage of the LDO regulator circuit at specified currents and wherein said measurements performed by the OCM circuitry comprise output voltage measurements of an output driver circuit connected to the LDO regulator circuit, wherein a current mirror circuit controlled by a current DAC controls current of the output driver circuit;
    c) sending test results from the OCM to the FSM;
    d) sending the test results to the ATE from the FSM; and
    e) selecting a next LDO regulator circuit of the plurality of LDO regulator circuits and returning to step b) when additional LDO circuits remain to be tested, else end.

2. The method of claim 1, wherein the output of the LDO regulator is compared against a high and a low voltage references formed by resistor divider circuits.

3. The method of claim 1, wherein said output driver circuit is formed by a pass transistor, wherein said pass transistor is divided into at least two separate transistor portions operating in parallel and operatively controlled to allow each of the at least two transistor portions to be tested individually.

* * * * *